United States Patent
Stevens et al.

(10) Patent No.: US 9,668,355 B2
(45) Date of Patent: May 30, 2017

(54) COMBINING DIFFERENT TYPES OF MOISTURE-RESISTANT MATERIALS

(71) Applicant: HzO, Inc., Draper, UT (US)

(72) Inventors: Blake Stevens, Morristown, NJ (US); Yang Yun, Draper, UT (US)

(73) Assignee: HZO Inc., Draper, UT (US)

( * ) Notice: Subject to any disclaimer, the term of this patent is extended or adjusted under 35 U.S.C. 154(b) by 160 days.

(21) Appl. No.: 14/213,765

(22) Filed: Mar. 14, 2014

(65) Prior Publication Data
US 2014/0268526 A1 Sep. 18, 2014

Related U.S. Application Data

(60) Provisional application No. 61/786,561, filed on Mar. 15, 2013, provisional application No. 61/786,579, filed on Mar. 15, 2013.

(51) Int. Cl.
H05K 3/28 (2006.01)
(52) U.S. Cl.
CPC ....... *H05K 3/284* (2013.01); *H05K 2201/015* (2013.01); *H05K 2203/1322* (2013.01); *Y10T 428/24802* (2015.01); *Y10T 428/24851* (2015.01); *Y10T 428/24942* (2015.01); *Y10T 428/31504* (2015.04)

(58) Field of Classification Search
CPC .... Y10T 428/24802; Y10T 428/31504; H05K 3/284
See application file for complete search history.

(56) References Cited

U.S. PATENT DOCUMENTS

| | | | |
|---|---|---|---|
| 5,137,780 A | 8/1992 | Nichols et al. | |
| 5,595,625 A | 1/1997 | Fishel et al. | |
| 8,034,419 B2 * | 10/2011 | Erlat | C23C 16/30 204/192.1 |
| RE43,651 E | 9/2012 | Badyal et al. | |
| 2008/0185173 A1 * | 8/2008 | Bedinger | H01L 23/3192 174/258 |
| 2012/0051007 A1 | 3/2012 | Alavarez et al. | |

OTHER PUBLICATIONS

United States Patent and Trademark Office Acting As the International Search Authority, "International Search Report and Written Opinion," mailed Aug. 1, 2014, in related PCT application No. PCT/2014/029686.

* cited by examiner

*Primary Examiner* — Gerard Higgins
(74) *Attorney, Agent, or Firm* — Kunzler Law Group

(57) ABSTRACT

Protective coatings, including moisture-resistant coatings, that include two or more different types of moisture-resistant materials are disclosed, as are moisture-sensitive substrates that include such protective coatings. Moisture-sensitive substrates that include different types of moisture-resistant coatings on different elements are also disclosed.

6 Claims, 1 Drawing Sheet

COMBINING DIFFERENT TYPES OF MOISTURE-RESISTANT MATERIALS

CROSS-REFERENCE TO RELATED APPLICATIONS

A claim is hereby made, pursuant to 35 U.S.C. §119(e), for the benefit of priority to the Mar. 15, 2013 filing date of U.S. Provisional Patent Application No. 61/786,579, titled "COATINGS AND METHODS INCLUDING DIFFERENT TYPES OF MOISTURE RESISTANT MATERIALS," and to the Mar. 15, 2013 filing date of U.S. Provisional Patent Application No. 61/786,561, titled "ELECTRONIC DEVICES WITH DIFFERENT TYPES OF COATINGS ON DIFFERENT FEATURES," the entire disclosures of both of which are hereby incorporated herein.

TECHNICAL FIELD

This disclosure relates generally to the use of different types of moisture-resistant materials in combination. More specifically, this disclosure relates to protective coatings that include two or more types of moisture-resistant materials, and to moisture-sensitive substrates that include such protective coatings. This disclosure also relates to moisture-sensitive substrates with different types of moisture-resistant materials on different elements.

SUMMARY

As used herein, the terms "moisture-resistant" and "moisture-resistance" refer to the ability of a coating to prevent exposure of a coated element or feature to moisture. As an example, a moisture-resistant coating may resist wetting or penetration by one or more types of moisture, or it may be impermeable to one or more types of moisture or substantially impermeable to one or more types of moisture—the term "substantially" indicating that over long durations of time, some moisture may migrate through the coating. Both moisture impermeable and substantially moisture impermeable barriers are, for the sake of simplicity, referred to herein as "moisture impermeable" barriers. As another example, a moisture-resistant coating may repel one or more types of moisture; for example, the moisture-resistant coating may have an outer surface that is configured (e.g., structurally (e.g., lotus leaf-type structures, etc.), chemically (e.g., hydrophobic materials, etc.), etc.) to repel moisture.

In some embodiments, a moisture-resistant coating may be impermeable to, substantially impermeable to and/or repel water, an aqueous solution (e.g., salt solutions, acidic solutions, basic solutions, drinks, etc.) or vapors of water or other aqueous materials (e.g., humidity, fogs, mists, wetness, etc.). Use of the term "moisture-resistant" to modify the term "coating" should not be considered to limit the scope of materials from which the coating protects one or more components of an electronic device. The terms "moisture-resistant" and "moisture-resistance" may also refer to the ability of a coating to restrict permeation of or repel organic liquids or vapors (e.g., organic solvents, other organic materials in liquid or vapor form, etc.), as well as a variety of other substances or conditions that might pose a threat to a substrate (e.g., a moisture-sensitive substrate, etc.), such as an electronic device or its components.

In one aspect, this disclosure relates to protective coatings. A protective coating according to this disclosure may include two or more different types of moisture-resistant materials. In some embodiments, the two or more different types of moisture-resistant materials may comprise discernibly discrete portions (e.g., sub-layers, etc.) of the protective coating. In other embodiments, the protective coating may include a gradient, or gradual transition, between two or more different types of moisture-resistant materials.

Methods for forming such a protective coating are also disclosed. Such a method may include separately defining (e.g., depositing, etc.) portions of a protective coating. Alternatively, two or more types of moisture-resistant materials may be co-deposited. As another option, different types of moisture-resistant materials may be deposited in a sequential, overlapping manner, which may result in coatings that include material gradients, or are graded.

According to another aspect, a substrate may include at least one protective coating that includes two or more different moisture-resistant materials. In embodiments where the first type of moisture-resistance includes impermeability to moisture and the second type of moisture-resistance includes moisture-repellence, the second type of moisture-resistance may be disposed atop the first type of moisture-resistance. Alternatively, the second type of moisture-resistance may be located closer than the first type of moisture-resistance to a substrate, such as a component or other feature of an electronic device.

In addition, or as an alternative, a substrate may include different elements that are protected by protective coatings formed from different types of moisture-resistant materials. In a specific embodiment, a moisture-repellant material may be applied to some elements, while a moisture barrier may be applied to other elements.

Such an embodiment of moisture-resistant protection may be particularly useful for protecting state of the art mobile electronic devices from accidental or incidental exposure to moisture. One material may provide the primary type of moisture-resistance—a moisture-impermeable coating or barrier that covers and seals or substantially seals at least some moisture-sensitive components or other features within the interior of an electronic device in a manner (e.g., confluently, etc.) that will prevent moisture from contacting those components or other features, should moisture enter into the interior of the electronic device. However, confluent coatings may have a detrimental effect on the performance or even the operation of some components of an electronic device (e.g., microphones, speakers, optical elements, etc.). Nonetheless, those components and/or the electronic device(s) of which they are a part may benefit from moisture resistance (e.g., by preventing moisture from entering into the interior of such a component, into the interior of the electronic device of which the component is a part, etc.).

The secondary type of moisture resistance provided by another material may not provide the same degree of resistance to moisture as the primary type of moisture resistance. In any event, the material providing the secondary type of moisture resistance may be used to coat components or other features that are not compatible with the primary type of moisture resistance, but are compatible with a less protective type of moisture resistance. Providing components or other features with the secondary type of moisture resistance will impart those components or features with at least some ability to withstand exposure to moisture, which is better protection than those components or features would receive if they were to lack protection against moisture. Some embodiments of the secondary layer may be configured to enable electrical communication therethrough; for example, a secondary layer may be electrically conductive or it may be too thin to prevent electricity from passing therethrough. In other embodiments, the thickness (or thinness) of the secondary layer may enable its ready removal from electrically conductive features (e.g., communication ports, contacts, etc.) to expose the same and, thus, to facilitate electrical connections to the exposed electrically conductive features.

In other various embodiments, the substrate may comprise an industrial device, a vehicular device, a precision mechanical device, a medical device, a scientific instrument, an article of clothing or the like.

Some components or features of a moisture-sensitive substrate, such as an electronic device, may lack a moisture-resistant coating or barrier. These components or feature may include, but are not limited to, surfaces of components and/or features exposed to an exterior of the moisture-sensitive substrate, as well as components and/or features located within an interior of the moisture-sensitive substrate.

Other aspects, as well as features and advantages of various aspects, of the disclosed subject matter will be apparent to those of ordinary skill in the art through consideration of this disclosure and the appended claims.

DETAILED DESCRIPTION

Figure 1:
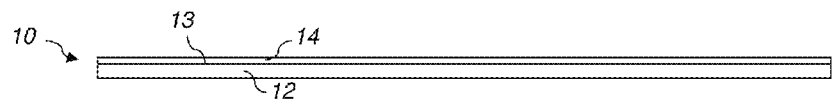
FIG. 1 provides a cross-sectional representation of an embodiment of a protective coating that includes two portions comprising different materials, with a discernible boundary between the two portions.

With reference to FIG. 1, an embodiment of a protective coating 10 is illustrated. The protective coating 10 may, as illustrated, comprise a film, although other configurations of protective structures are also within the scope of this disclosure. The protective coating 10 includes at least two different materials 12, 14, etc., and is configured to provide moisture-resistance. In protective coating 10, the materials 12, 14 define different portions of the protective coating 10, such as the sub-layers or sub-coatings illustrated by FIG. 1. In such an embodiment, a visibly discernible boundary 13 may exist between the discrete portions that are defined by two different materials 12 and 14.

Figure 2:
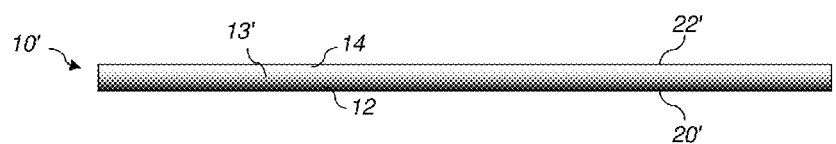
FIG. 2 is a cross-sectional representation of another embodiment of protective coating, which includes a gradient of at least two different materials.

FIG. 2 illustrates another embodiment of protective coating 10'. Instead of a discernible boundary 13 (FIG. 1), protective coating 10' includes a transition 13', or gradient, between two or more materials 12 and 14. Thus, a base 20' of the protective coating 10' may consist of or consist essentially of a first material 12, and an outer surface 22' of the protective coating 10' may consist of or consist essentially of a second material 14, but at least some regions therebetween, such as the transition 13', include two or more materials, such as material 12 and material 14.

Figure 3:
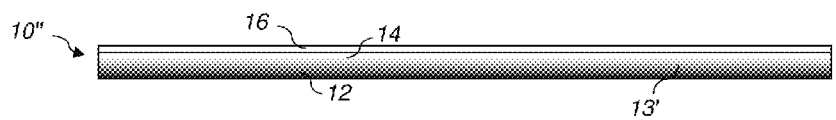
FIG. 3 provides a cross-sectional representation of yet another embodiment of protective coating, which includes a material that defines a portion that is discrete from at least one other portion of the protective coating, as well as a portion that includes a gradient between two or more materials.

As illustrated by FIG. 3, protective coatings 10" that include one or more materials 16 that define a corresponding number of discrete portions, as well as two or more materials 12 and 14 that define a portion with a transition 13', are also within the scope of this disclosure.

The two or more portions of a protective coating 10, 10', 10" may be superimposed across an entire extent of the protective coating 10, 10', 10" or across substantially all of the protective coating 10, 10', 10".

Figure 4:
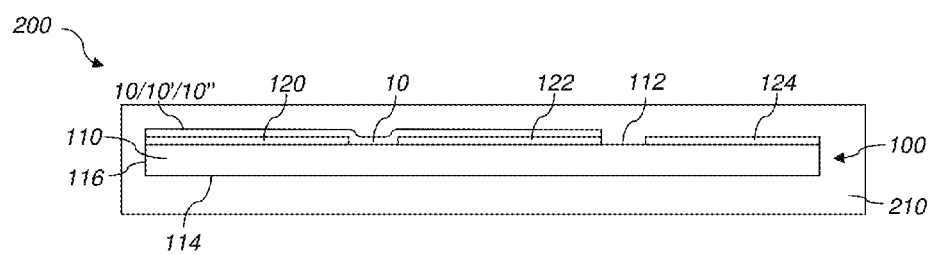
FIG. 4 illustrates an embodiment of a substrate that includes a protective coating that comprises at least two different materials.
Figure 5:
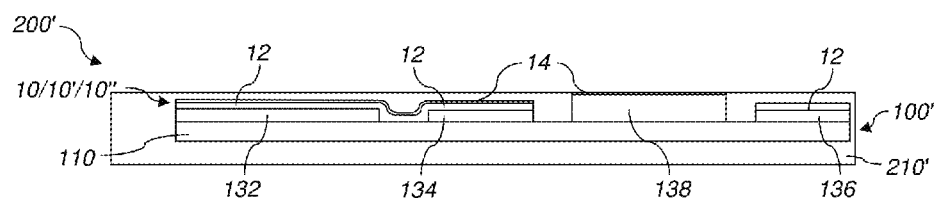
FIG. 5 depicts an embodiment of a substrate with different elements that are at least partially covered with protective coatings that include different materials from one another.

In some embodiments, each material 12, 14, 16 of a protective coating 10, 10', 10" may comprise a moisture-resistant material. Alternatively, an outermost material 14, 16 may comprising a capping material that may protect and/or enhance a moisture-resistant property of an underlying moisture-resistant material 12, 14. As another alternative, a material 12 at a base of the protective coating 10, 10', 10" may promote adhesion between a moisture-resistant material 14 and a substrate 100, 100' (FIGS. 4 and 5, respectively). Optionally, a portion of a protective coating 10, 10', 10" (e.g., material 12, material 14, material 16, etc.) may impart the protective coating 10, 10', 10" with at least one desired characteristic (e.g., thermal conductivity, electrical insulation, a desired texture, a desired surface finish, etc.).

In some embodiments where at least two materials 12, 14—and the corresponding portions—of a protective coating 10, 10', 10" comprise moisture-resistant materials, both materials 12, 14 may provide the same type or similar types of moisture resistance. As an example, materials 12 and 14 may both be substantially impermeable to water or impermeable to water, although material 12 may have a different impermeability to water than material 14. In addition to providing the same type or substantially the same type of moisture-resistance, one of the materials 12, 14 may provide an additional type of moisture resistance from the other of the materials 14, 12. As an example, material 14 may be moisture-impermeable, while material 12 may be impermeable to moisture and repel moisture. In a specific embodiment, a material 12 at the base of a protective coating 10, 10', 10" may be formed from parylene C, which is a poly(p-xylylene) in which some hydrogens have been replaced with chlorine, while a material 14 at an outer portion of the protective coating 10, 10', 10" may include a parylene with some fluorine substitutions. The fluorine substitutions of such an embodiment may impart the outer portion of the protective coating 10, 10', 10" with added moisture repellence.

In other embodiments where at least two materials 12, 14—and the corresponding portions—of a protective coating 10, 10', 10" comprise moisture-resistant materials, the materials 12, 14 of the protective coating 10, 10', 10" may provide different types of moisture-resistance from one another. Such a protective coating 10, 10', 10" may provide a primary type of protection for a majority of the moisture sensitive elements, or components, of a substrate and a secondary type of protection for elements, or components, of the substrate that do not perform as desired or that are otherwise incompatible with the primary type of protection.

In a specific embodiment, the primary type of protection may comprise a coating or other barrier material that is moisture-impermeable. Such a coating may have a thickness that imparts it with a desired amount of impermeability to moisture. Specific, but non-limiting examples of moisture-impermeable materials include parylenes. A coating formed from such a moisture-impermeable material may have a thickness of about 1 µm (micrometer, or micron) to about 25 µm.

The secondary type of protection of such an embodiment may comprise a material that repels moisture. By way of example, and not by way of limitation, the secondary coating may comprise an ultrathin (with a layer thickness of about 100 Å or less) moisture-repellent material, such as a halogenated (e.g., fluorinated, etc.) polymer of the type disclosed by U.S. Reissued Patent RE43,651 E, the entire disclosure of which is hereby incorporated herein or another fluorinated polymer, or "fluoropolymer." Optionally, moisture repellence may be achieved with films or other structures that include moisture-repellent surface features (e.g., so-called "lotus leaf" structures, other structures that impart a surface with moisture repellence, etc.).

As a specific, but non-limiting example of the foregoing, with reference to FIGS. 1-3, material 12 may comprise parylene C, while material 14 may comprise a fluorinated polymer, or "fluoropolymer."

Although the preceding examples are specific, a variety of embodiments of moisture-impermeable materials may be used in a protective coating 10, 10', 10" according to this disclosure. As a non-limiting example, the polymer of a moisture impermeable barrier may comprise an unsubstituted or a substituted poly (p-xylylene), which is more commonly referred to as "parylene." Of course, any other material that may form a moisture impermeable (e.g., watertight, etc.) film or structure that will adhere to its intended substrate (e.g., a component configured to be within an interior of an electronic device, etc.) over time, during prolonged and/or repeated use of the substrate, while not having a detrimental effect on the substrate and without interfering with the function of the substrate may be used to form a moisture impermeable barrier.

Various types of moisture-repellent materials that may be used in a protective coating 10, 10', 10" according to this disclosure include materials that are compatible with, and that will adhere and remain adhered to other portions of a coating (e.g., adhesion promoters, moisture-impermeable materials, protective materials, etc.). The moisture-repellent characteristics of that material of the protective coating 10, 10', 10" may be attributable to one or more factors, including, but not limited to, the chemical properties of a material from which the moisture-repellent portion of the coating is formed, surface features of a moisture-repellant film or other moisture-repellant structure formed by the material (e.g., so-called "lotus leaf" structures, other structures that impart a surface with hydrophobicity and/or moisture-repellence, etc.), an electronegativity of the material and/or surface of the moisture-repellent portion, or any other property that contributes to moisture-repellency.

In some embodiments, a hydrophobic or moisture repellent portion of a coating may comprise a fluorinated material. Examples of suitable fluorinated materials include fluorinated parylenes (e.g., parylene AF-4, etc.), other fluorinated polymers (e.g., polytetrafluoroethylene (PTFE) (or TEFLON®), etc.), a halogenated (e.g., fluorinated, etc.) polymer of the type disclosed by U.S. Reissued Patent RE43,651 E and the like. Some embodiments of the hydrophobic or moisture repellent portion of a coating may comprise a hydrophobic or superhydrophobic material with a rough (e.g., microstructured, nanostructured, etc.) surface. Moisture-repellant nanoparticles may also be used as a material 12, 14 of a protective coating 10, 10', 10".

As indicated previously herein, a protective coating 10, 10', 10" may include a material 12 that promotes adhesion of the protective coating 10, 10', 10" or a portion thereof to a substrate or to another portion of the protective coating 10, 10', 10". Such an adhesion-promoting material may be selected on the basis of its ability to adhere to the structures between which the adhesion-promoting material resides (i.e., the substrate and a base portion of the protective coating 10, 10', 10", two portions of the protective coating 10, 10', 10", another coating on an outer surface of the protective coating 10, 10', 10", etc.). A variety of materials may be used to enhance adhesion and/or for any of a variety of other purposes, including, without limitation, ceramic materials, such as aluminum oxide (Al2O3), which is also commonly referred to as "alumina," boron nitride, or any of a variety of other materials.

Some non-limiting examples of capping materials that may be used as the outermost material 14, 16 of a protective coating 10, 10', 10" include aluminum oxide, diamond-like carbon (e.g., pure carbon, hydrogenated carbon, fluorinated carbon, nitrogenized carbon, phosphorylated carbon, etc., or combinations of any of the foregoing), silicon nitride, a metal oxide such as hafnium (IV) oxide ($HfO_2$), yttrium oxide ($Y_2O_3$) or zirconium dioxide ($ZrO_2$) or the like. As indicated previously herein, such a material may harden or toughen the surface of a protective coating 10, 10', 10", cover passageways through another material 12, 14 (e.g., a parylene, another moisture-impermeable material, etc.) of the protective coating 10, 10', 10", or otherwise enhance the functionality, durability (e.g., hardness, impact resistance, scratch resistance, abrasion resistance, wear resistance, etc.), etc., of the protective coating 10, 10', 10".

Turning now to FIGS. 4 and 5, embodiments substrates 100, 100', respectively, that include one or more protective coatings 10, 10', 10" are illustrated and described.

FIG. 4 shows an embodiment of a substrate 100; for example, a printed circuit board 110 carrying electronic components 120, 122, 124. One or more protective coatings 10, 10', 10" cover selected areas of the substrate 100. In the depicted embodiment, a protective coating 10, 10', 10" covers components 120 and 122, as well as a portion of the top side 112 of the printed circuit board 110 exposed between the components 120 and 122. In some embodiments, other areas of the substrate 100, such as the portion of the top side 112 of the printed circuit board 110 located between component 122 and component 124, and the component 124, may remain uncoated (i.e., no protective coating 10, 10', 10") is located over these areas of the substrate 100. In addition, peripheral edges 116 of the printed circuit board 100 and a back side 114 of the printed circuit board 110 may be exposed.

In some embodiments, a plurality of different types of protective coatings may cover different areas of a substrate. FIG. 5 is a representation of a substrate 100', such as an assembly or subassembly of an electronic device 200 (e.g., a mobile electronic device, such as a smart phone, a tablet computing device, a digital media player, etc.). The substrate 100' of FIG. 5 includes a printed circuit board 110 that carries various components 132, 134, 136, 138. In the depicted embodiment, a protective coating 10, 10', 10" that includes two or more materials 12, 14 (FIGS. 1-3) may cover some areas of the substrate 100', such as components 132 and 134, as well as a portion of the printed circuit board 110 located therebetween. A protective coating 10, 10', 10" that consists of or that consists essentially of a single material 14 may coat another of the components 138 of the substrate 100', while another protective coating 10, 10', 10" that consists of or that consists essentially of another single material 12 may coat yet another component 136.

In a more specific embodiment, material 12 may comprise a moisture-impermeable material (e.g., a parylene, etc.), and may be used to protect moisture-sensitive components 132, 134, 136 whose operation may remain substantially unimpeded by a coating of such a material 12. Material 14 may comprise a moisture-repellant material (e.g., a fluoropolymer, etc.), which may be applied over areas of material 12 that overlie particularly moisture-sensitive components 132, 134. In addition, such a material 14 may be applied directly to components 138 that will benefit from moisture resistance, but whose operation would be impeded by a coating of a moisture-impermeable material 12. Examples of such components include, but are certainly not limited to, microphones, speakers, optical elements, and the like. Of course, a substrate 100' may include any combination of protective coatings 10, 10', 10" the immediately preceding disclosure should not be considered to limit the manner in which protective coatings may be combined.

As illustrated by FIGS. 4 and 5, the protective coating(s) 10, 10', 10" and/or material(s) 12, 14 may be confined or substantially confined to components 120, 122, 124, 132, 134, 136, 138 within the interior 210, 210' of an electronic device 200, 200', such as within the interior of the housing or other external components of an electronic device. In other embodiments, a protective coating 10, 10', 10" and/or material 12, 14 may cover at least some components that are exposed to the outside of the electronic device 200, 200'.

Methods for applying one or more materials 12, 14, 16 and/or protective coatings 10, 10', 10" to a substrate 100, 100' are also disclosed. Two or more materials 12, 14 may be applied in a single process. When a single process is used to apply different materials 12, 14, the materials 12, 14 may be chemically similar to one another. With returned reference to FIGS. 1 and 2, in the example of a protective coating 10' in which the material 12 of a base portion comprises parylene C and the material 14 of an outer portion comprises a fluorinated parylene, the deposition process may start with precursors to the parylene C and transition to precursors for the fluorinated parylene. As the deposition process is initiated, all the precursors may comprise precursors to the parylene C. If the transition between precursors to parylene C and fluorinated parylene is abrupt, the resulting protective coating 10 may resemble that illustrated by FIG. 1. If the transition is gradual, the resulting protective coating 10' may resemble that depicted by FIG. 2. At the conclusion of the deposition process, all of the precursors may comprise precursors to the fluorinated parylene.

Alternatively, such a method may include two or more discrete processes in which different materials 12, 14, 16 (FIGS. 1-3) are applied to a substrate 100, 100' (FIGS. 4 and 5). The discrete processes may be carried out by the same equipment, even in the same application zone (e.g., deposition chamber, etc.), or by separate apparatuses (e.g., a chemical vapor deposition (CVD) chamber for parylene, including fluorinated parylenes; a plasma-enhanced CVD (PECVD) chamber for some fluoropolymers, for a diamond-like coating or for aluminum oxide; an atomic layer deposition (ALD) chamber for some fluoropolymers, for a diamond-like coating or for aluminum oxide; etc.) may be used to effect the discrete processes.

In some embodiments, a coating method may also include the application of a mask to selected regions of the substrate to prevent at least one portion of the coating from being applied to those portions. In embodiments where discrete processes are used to form different portions of a coating, the mask may be present while at least one material 12, 14, 16 (FIGS. 1-3) is applied to the substrate 100, 100' (FIGS. 4 and 5), but absent while at least one other material 12, 14, 16 is applied to the substrate; thus, some (masked) portions of the substrate 100, 100' will be covered by fewer portions of a coating than other (unmasked) portions of the substrate. In other embodiments, a mask may remain in place as all materials 12, 14, 16 are applied to the substrate 100, 100'. As a result, none of the materials 12, 14, 16 will cover those areas of the substrate 100, 100'.

Although the foregoing disclosure provides many specifics, these should not be construed as limiting the scope of any of the ensuing claims. Other embodiments may be devised which do not depart from the scopes of the claims. Features from different embodiments may be employed in combination. The scope of each claim is, therefore, indicated and limited only by its plain language and the full scope of available legal equivalents to its elements.

What is claimed:

1. An electronic device, comprising:
   a housing defining an interior and an exterior of the electronic device;
   a plurality of electronic components exposed to the interior of the electronic device; and
   a first protective coating covering at least two electronic components of the plurality of electronic components, the protective coating comprising:
     a first portion applied to the at least one electronic component and comprising a first material, the first material providing substantial impermeability to moisture;
     a second portion comprising a second material and providing moisture-repellence, wherein the second material comprises a halogenated polymer; and
     a gradual transition between the first portion and the second portion comprising a gradient of the first material and the second material.

2. The electronic device of claim 1, wherein the first material comprises parylene C.

3. The electronic device of claim 1, wherein the first material comprises an adhesion-promoting material.

4. The electronic device of claim 1, wherein the second material comprises a fluorinated parylene.

5. The electronic device of 1, further comprising:
   a second protective coating covering portions of the plurality of electronic components distinct from the first protective coating, the second protective coating comprising the first material and providing substantial impermeability to moisture.

6. The electronic device of claim 1, further comprising:
   a second protective coating covering portions of the plurality of electronic components distinct from the first protective coating, the second protective coating comprising the second material and providing moisture-repellence.

* * * * *